US008664978B2

(12) United States Patent
Lu et al.

(10) Patent No.: US 8,664,978 B2
(45) Date of Patent: Mar. 4, 2014

(54) METHODS AND APPARATUS FOR TIME TO CURRENT CONVERSION

(75) Inventors: Chung-Ting Lu, Hsin-Chu (TW); Chung-Chieh Yang, Hsin-Chu (TW); Chin-Hua Wen, Toufen Township (TW); Chih-Chiang Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/221,628

(22) Filed: Aug. 30, 2011

(65) Prior Publication Data

US 2013/0049810 A1    Feb. 28, 2013

(51) Int. Cl.
*H03D 13/00* (2006.01)
*H03K 3/017* (2006.01)

(52) U.S. Cl.
USPC ............... 327/43; 327/175; 327/102; 327/38; 324/762.01

(58) Field of Classification Search
USPC ................. 327/37, 38, 35, 102, 175, 427, 43; 324/762.01
See application file for complete search history.

(56) References Cited

U.S. PATENT DOCUMENTS

| H1458 H | * | 7/1995 | Slack ........................ 324/76.13 |
|---|---|---|---|
| 5,550,702 A | * | 8/1996 | Schmidt et al. ............... 361/103 |
| 6,990,422 B2 | * | 1/2006 | Laletin et al. ................. 702/109 |
| 7,541,839 B2 | * | 6/2009 | Hayashi et al. ................ 326/83 |
| 8,076,979 B2 | * | 12/2011 | Kathuria et al. ............. 331/1 R |
| 2012/0081141 A1 | * | 4/2012 | Jenkins et al. ........... 324/762.01 |

OTHER PUBLICATIONS

Plesnarski, et al., "Identify Direct/Inverse Proportions = Solve Proportional Problems", Jul. 1, 2009, PDE/BCTE Math Council.*
Meade, R., et al., "Foundations of Electronics: Circuits and Devices", 2003, Thomson Learning, 4th Edition.*
Levine, P.M., et al., "A High-Resolution Flash Time-to-Digital Converter and Calibration Scheme," ITC International Test Conference, Paper 40.2, 2004 IEEE, pp. 1148-1157.
Pei, S., et al., "A Low Overhead On-chip Path Delay Measurement Circuit," 2009 Asian Test Symposium, IEEE Computer Society, 2009 IEEE, pp. 145-150.
Tsai, M.-C., et al., "An All-Digital High-Precision Built-In Delay Time Measurement Circuit," 26th IEEE VLSI Test Symposium, IEEE Computer Society, 2008 IEEE, pp. 249-254.

* cited by examiner

*Primary Examiner* — Lincoln Donovan
*Assistant Examiner* — Thomas Skibinski
(74) *Attorney, Agent, or Firm* — Slater & Matsil, L.L.P.

(57) ABSTRACT

A time to current conversion apparatus and methods. An impedance having an input for selectively receiving a time varying periodic signal or a known voltage signal is provided; and a current output is coupled to the impedance. By observing the average current through the impedance for the known voltage signal over a time period, and by observing the average current through the impedance for a time varying periodic signal, the duty cycle of the time varying periodic signal may be determined by evaluating a ratio of a first average current observed at the current output while the time varying periodic signal is coupled to the impedance to a second average current observed at the current output while the known voltage signal is coupled to the impedance. An embodiment time to current converter circuit is disclosed. Method embodiments for determining the duty cycle of a time varying periodic signal are provided.

20 Claims, 7 Drawing Sheets

METHODS AND APPARATUS FOR TIME TO CURRENT CONVERSION

BACKGROUND

A common requirement for an advanced electronic circuit and particularly for circuits manufactured as integrated circuits ("ICs") in semiconductor processes is the need to accurately measure timing quantities such as jitter, duty cycle, pulse width, frequency, signal delays, and between signal timing. Use of on board timing measurement circuitry using prior art approaches often requires complex circuitry and significant silicon area. Further, in order to perform accurate measurements of delays, duty cycles, or pulse widths, calibration of the on board circuitry may be required, adding time and cost to the use of these approaches. The need to make such measurements for signals that are internal to an advanced integrated circuit of a system on a chip ("SoC") device may make wafer probing or other external measurements difficult or impossible to perform.

One known time measurement approach, a time quantizer or time-to-digital converter circuit ("TDC") uses delay taps or delay buffers with counters or shift registers. The delays may be of a common delay chained in series, or the delays may be in parallel but increase by the constant tau from one stage to the next. This TDC approach requires significant circuit area (silicon area), and often, also requires calibration after the integrated circuit ("IC") or system on a chip ("SoC") is manufactured. In one known approach a tapped vernier delay line with buffers coupled in series is used to clock a counter or a register chain, the data input is a signal with a pulse, and the tapped delay line also receives the same pulse. When the registers are clocked by the delayed pulse, the outputs of the stages that are, for example, a "1", indicates the pulse width of the pulse. The digital output may be a thermometer code, for example.

These known approaches are also limited either in measurement range, or, in the fineness of the resolution. That is, in known approaches there is a design tradeoff between resolution, and range, of the measurement. For example, in a tapped delay line TDC the number of stages used forms a practical limit. When very fast buffers are used in the taps, or delays, of the delay line, the resolution is increased; but the measurement range is limited. On the other hand, the use of slower taps or delays may expand the maximum range that can be measured, but the smallest delay that can be measured (fine resolution) is then limited to a multiple of these delay times. Interpolation must be used to determine times of less than the minimum resolution, which is less accurate. Thus, design tradeoffs must be made to provide a practical measurement circuit with acceptable range, and resolution. Even so, these circuits require large silicon area. In another known approach, dual slope circuitry may be used and then converted to a digital quantity. The dual slope approaches of the prior art, which use analog delay circuitry with a digital conversion, also require significant circuitry to implement.

The known approaches may also require calibration. Calibration is needed because these delay measurements depend on the physical values of circuit elements, such as delay buffers, or other process dependent variables. Each integrated circuit manufactured in a semiconductor process will have some physical variation that affects the measurement; therefore each on board TDC circuit must be calibrated before measurements are made in order to achieve sufficient accuracy in the results. Calibration requires trimming or other adjustments, and additional bench time and often operator time to perform, and thus adds significant costs to the use of the measurement circuitry.

A continuing need thus exists for time measurement circuitry and methods that overcome the disadvantages of the prior art approaches.

BRIEF DESCRIPTION OF THE FIGURES

For a more complete understanding of the present embodiments, and the advantages thereof, reference is now made to the following descriptions taken in conjunction with the accompanying drawings, in which.

Figure 1:
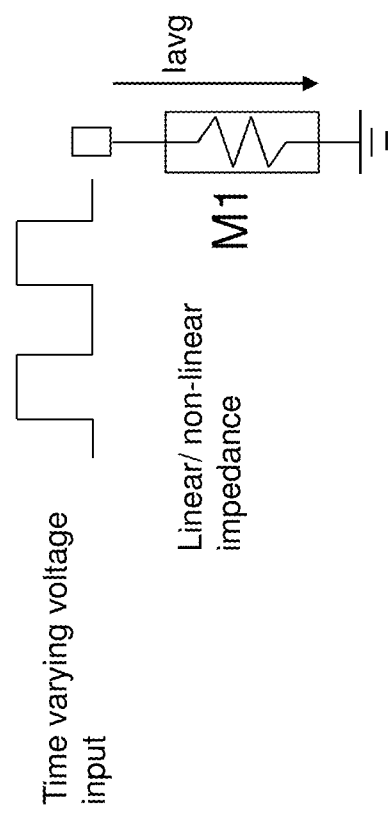
FIG. 1 depicts an impedance and a periodic time varying input signal which may be used with the embodiments.

The drawings, schematics and diagrams are illustrative and not intended to be limiting, but are examples of embodiments of the invention, are simplified for explanatory purposes, and are not drawn to scale.

DETAILED DESCRIPTION

The making and using of the present embodiments are discussed in detail below. It should be appreciated, however, that the present application provides many applicable inventive concepts that can be embodied in a wide variety of specific contexts. The specific embodiments discussed are merely illustrative examples illustrating specific ways to make and use the invention, and do not limit the scope of the invention.

Example embodiments which are now described in detail provide novel time to current converter methods, and circuits that utilize the methods. Advantageously, the methods operate by converting time to a current that can be observed without dependence on the physical devices used to measure. The values and tolerances of circuit elements do not affect the measurements made. The methods therefore provide accurate time measurements that are independent of the physical values of circuit elements and unaffected by process variations. The time to current measurements provided by the method embodiments can have a wider range and simultaneously provide finer resolution than the time or delay measurement approaches known in the art. In embodiments, external current meters may be used with the embodiment time to current methods to form the measurement, while in alternative embodiments the current measurement may be performed by circuitry integrated along with the time to current converter circuitry.

In embodiments, methods are provided that convert a time quantity, such as a delay or a duty cycle, to a current. The methods may be used to measure various time parameters including rise and fall times, and relative delays between timing signals, as well as unknown duty cycles and unknown delays.

Embodiments include using a combination of logical gates to extract timing information between two signals. For example, timing information may include delay between signals or between clock signals, frequency, and duty cycle. The timing information is collected in a comparison between signals. The timing information may be converted to a current. In embodiments, the observed current for an unknown timing can be compared to the current for a known timing to extract the unknown timing information. In embodiments, the timing information can be observed repeatedly to further obtain timing information.

In an embodiment method, a known signal such as a DC voltage or a known duty cycle signal is supplied to an impedance. An average current is observed. A signal of interest, such as a signal with an unknown duty cycle, is supplied to the same impedance. Over a number of cycles, the current through the impedance is observed, with current flowing for a portion of the signal having the unknown duty cycle for example. The ratio of the two currents provides the relationship of the unknown timing parameter, such as an unknown duty cycle, to a known timing signal. Thus, the unknown timing parameter may be determined. The use of the ratio approach removes any dependence on the physical characteristics of the impedance from the measurement; thus, the measurement is free from errors due to process variation, device tolerances or variations, temperature dependence and the like. Further, by observing the current repeatedly over a number of cycles, measurement errors due to noise or measurement equipment tolerances can be removed from the final measurement. The time to current converter methods therefore provide accuracy unavailable using prior approaches.

In an embodiment, a circuit is provided that can supply either a known duty cycle signal or DC voltage to an impedance. Also the circuit can selectively provide a time varying periodic signal to the impedance. This time varying periodic signal may be a signal with an unknown duty cycle or with an unknown active high time. In a method embodiment, a first measurement is made of the DC current or the average current due to the known signal. A second measurement is made of the average current over the same time period drawn by the impedance due to the time varying periodic signal. By observing a simple relationship between the duty cycle and the two current measurements, the unknown duty cycle may be determined as an active time, or as a percentage of the known time period. For an impedance comprising a resistor, this relationship is a ratio of the currents multiplied by the time period of the fixed or known voltage signal. For other impedance elements, similar relationships can be determined. By coupling an external current meter to the impedance, the measurements may be made in an accurate manner. Alternative embodiments include providing an on board current measurement circuit for making the measurements.

Applications for the embodiments are many and include determining unknown duty cycles, and determining delays in a device under test or circuit path, measuring frequency of a periodic signal, measuring jitter, measuring rise and fall times, and measuring timing of events relative to a known clock signal. Unlike prior art approaches, the physical value of the impedance is not part of the final measurement, thus no calibration of the devices is required prior to or during the making of time measurements. This eliminates an expensive step at a tester or probe station, and also eliminates trimming, fuse programming, or other calibration of physical devices required in known approaches. Thus use of the embodiments provides accurate measurements at lower cost than prior approaches. Further, a simple test circuit embodiment is provided that needs only a small silicon area to implement and thus lowers cost still more, compared to more complex solutions used in prior circuits.

The time to current converter embodiments may be used in a completed integrated circuit or SoC device as part of a self-test or system test. The time to current embodiments may be provided as an in circuit or on board circuit for wafer acceptance test ("WAT"), to be used as a process monitor in a semiconductor manufacturing environment. The time to current circuitry embodiments may be used as a portion of a tester or other equipment. The time to current measurements may be made prior to wafer dicing, as part of a device qualification or binning operation. The method embodiments also may be used later, as part of a system measurement in a packaged integrated circuit, to evaluate signal timings in an operating integrated circuit.

In FIG. 1, an impedance M1, either linear or non-linear, is depicted to illustrate features and operating concepts of the embodiments. In FIG. 1, a time varying voltage input, such as a clock signal, is input to the impedance M1. The average current Iavg through the impedance is proportional to the high portions of the time varying input signal, that is, the average current over a period is proportional to the duty cycle. Thus, by measuring the average current for a time period that includes an integral multiple of cycles such as, for a non-limiting example, by measuring the average current over 100 periods, the duty cycle can be calculated. The physical value of the impedance is not important, as the proportion of currents provides a relative measure and thus, the duty cycle measurement is not dependent on the value of the impedance itself. Embodiments of the invention advantageously provide accurate measurements that do not depend on the value of the circuit elements and are independent from semiconductor process variation effects, thus eliminating the need for calibration or trimming that arises in prior art approaches. Put another way, the value of the impedance is not a part of the time to current measurement, as the use of the ratio approach removes it from the measurement.

Figure 2A:
FIG. 2A depicts a timing diagram.
Figure 2B:
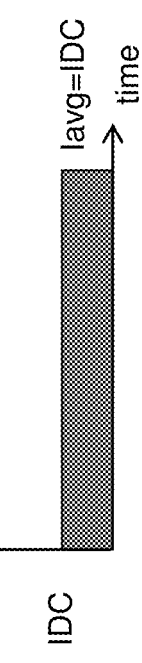
FIG. 2B depicts another timing diagram and FIG. 2C depicts another timing diagram for illustrating operations of the embodiments.
Figure 2C:
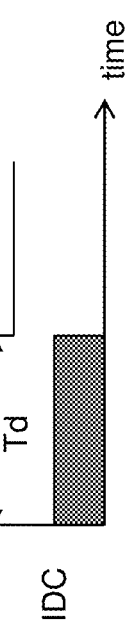

FIGS. 2A-2C illustrate in timing diagrams the operation of the embodiments. In FIG. 2A, an average DC current is determined. In order to make this measurement, a fixed voltage such as DC supply voltage is provided as an input to the impedance (such as M1 in FIG. 1), and the average current is determined over a time period. This current is then the current that would flow if the clock signal or other time varying signal was always high, and thus, this current is the maximum average DC current Iavg for a clock period.

FIG. 2B illustrates the average current obtained for a time varying signal; here, a 50% duty cycle clock signal, for a single period Tck. The current IDC is the current that flows for the half of the clock cycle that the input signal is active or high (Td). The shaded portion of the signal in FIG. 2B represents the current. The average current for this example would be 50% of the average current in FIG. 2A, which is proportional to the duty cycle (Td is 50% of Tck).

Another example is shown in the timing diagram of FIG. 2C. In FIG. 2C, a time varying input signal; here, a 25% duty cycle clock signal, is illustrated. The shaded portion of the timing diagram in FIG. 2C represents the current that would flow for the case when the signal is active high for 25% of the clock period. The average current as shown in FIG. 2C is 25% of the average current shown in FIG. 2A, and the duty cycle is also proportional to the average current during the clock cycle (Td is 25% of Tck).

A mathematical form of the relationship used here is given by this equation:

$$Td = \frac{Iavg \times Tck}{Idc} \qquad \text{Equation 1}$$

These concepts are applied to make efficient novel time to current ("TCC") conversion circuits and methods. By comparing the average current proportion to the observed current, timing information of an unknown timing quantity can be extracted.

Figure 3:
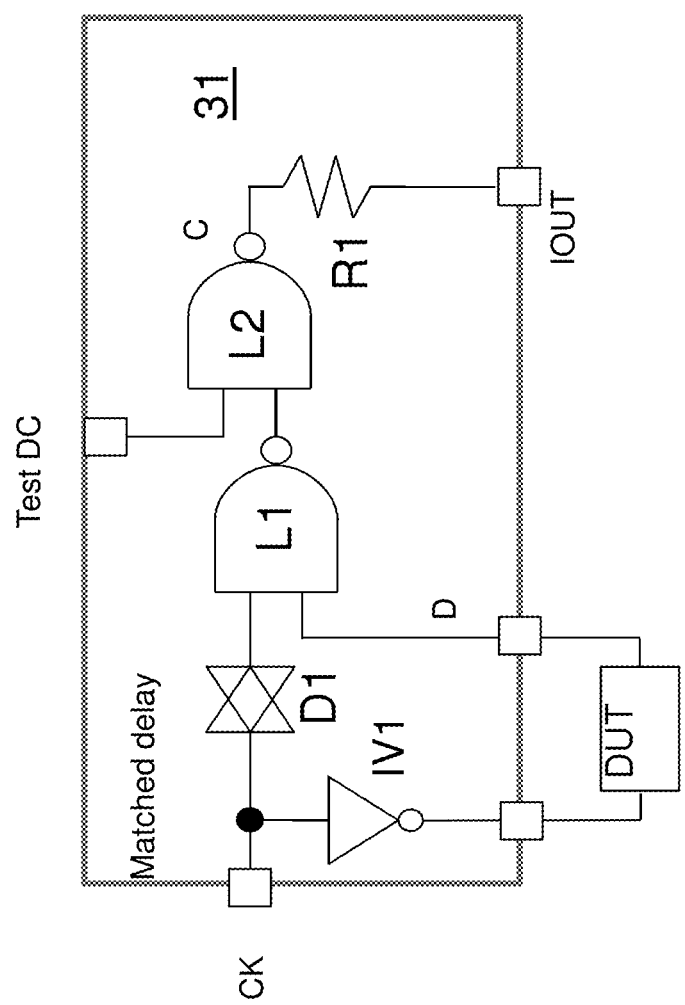
FIG. 3 depicts in a simplified schematic a circuit embodiment.

FIG. 3 depicts an embodiment TCC circuit. It should be clear that this embodiment circuit is but one illustrative circuit incorporating the embodiment methods, but is not limiting on the embodiments and does not limit the scope of the appended claims. The circuit 31 may be formed on an integrated circuit, such as a SoC, with a circuit or device under test such as the device under test labeled DUT in the figure. In alternative embodiments, the circuit 31 may be part of a tester or separate test circuit. The device under test ("DUT") adds delay to a signal. To determine the value of the delay, TCC circuit 31 is used. A clock or known periodic signal is coupled to the input CK and then coupled to the input of the DUT through an inverter IV1, and the signal CK is also input to a logic gate L1 using a matched delay D1. The delay D1 matches the delay through the inverter IV1. Thus, the two signals, the clock input received through the matched delay D1 and the delayed signal D received through the DUT, arrive at the inputs of the logic gate L1 with the delay through the DUT being the only delay affecting the timing of the two signals. For example, if the DUT delay is zero, the signals would arrive at the gate L1 at the same time. The logic gate L1 is a NAND function, so that it will output a logic "0" when the signals at the inputs to the logic gate L1 are both a logic "1". In this way, the logic gate L1 detects when the two signals, the clock signal CK, and the delayed signal D from the DUT device, overlap in time.

A second logic gate L2 receives the output of gate L1 and logically combines this with a test input labeled "Test DC" and outputs a voltage at node "c". As this gate is also a logic NAND gate, it will output a high voltage or logic "1" when either input is a "0", and it will output a logic "0" or low voltage when both inputs are logic "1" or high voltage levels.

In a time to current converter operation, two measurements are made. When the input Test DC is logic "0", the NAND gate L2 always outputs a logic "1" output at node "c". As this logic "1" is typically a high voltage, this provides a DC voltage (over a given time period, it can be maintained as a DC voltage indefinitely using the Test DC input) to the impedance, and the current flowing through the impedance, here a resistor R1, is a DC current. This current is measured at the IOUT terminal. The average current Iavg is then equal to the DC current (Idc). Thus, by using the input Test DC to cause L2 to output a high voltage at node "c" over a period, the average DC current Idc may be measured at the output IOUT. In short, the average current Idc in Equation 1 can be determined when the test input Test DC is logic "0".

When the test input Test DC is a logic "1", then the output "c" is determined by the output of logic gate L1, and the output of L2 is a "1" when the output of logic gate L1 is a "0". That is, when the D signal (the delayed and inverted clock signal CK following the delay through the device under test DUT) is overlapping the clock input CK at the inputs of L1, a pulse at the output of L1 will be inverted and output at node c. This pulse voltage, when taken through the impedance R1, will then form an average current that can be measured at output IOUT, and the average current Iavg forms the current that is proportional to the delay of the DUT. Thus, the current Iavg is proportional to the delay of the DUT in Equation 1; and this current can be determined when the test input Test DC is at a logic "1".

The example impedance R1 in the circuit 31 in FIG. 3 is a resistor. Resistors on board integrated circuits may be provided in a variety of ways, including but not limited to the use of diffusion resistors, polysilicon resistors, and the use of other materials that provide electrical conductivity with resistance. The physical value of the resistor R1 is not critical to the time to current measurement, only the average current measured in response to the logic circuitry output. Process dependent or temperature dependent device variations are also not critical, as they do not impact the time to current converter measurements. In alternative embodiments, other non-linear impedances may be used. RC and LC impedances may be used, for example.

In an alternative method embodiment, a periodic signal of known duty cycle may be first applied to the impedance, instead of a DC voltage, and an average current determined. Then a signal of unknown duty cycle may be applied, the average current for that signal determined, and using the relationship of Equation 1, a relative measure of the duty cycle of the unknown signal may be determined, and since the first signal is known, the duty cycle or active high time may be determined for the unknown duty cycle signal. A known clock signal is often available for the first measurement, as one non-limiting example embodiment.

Figure 4:
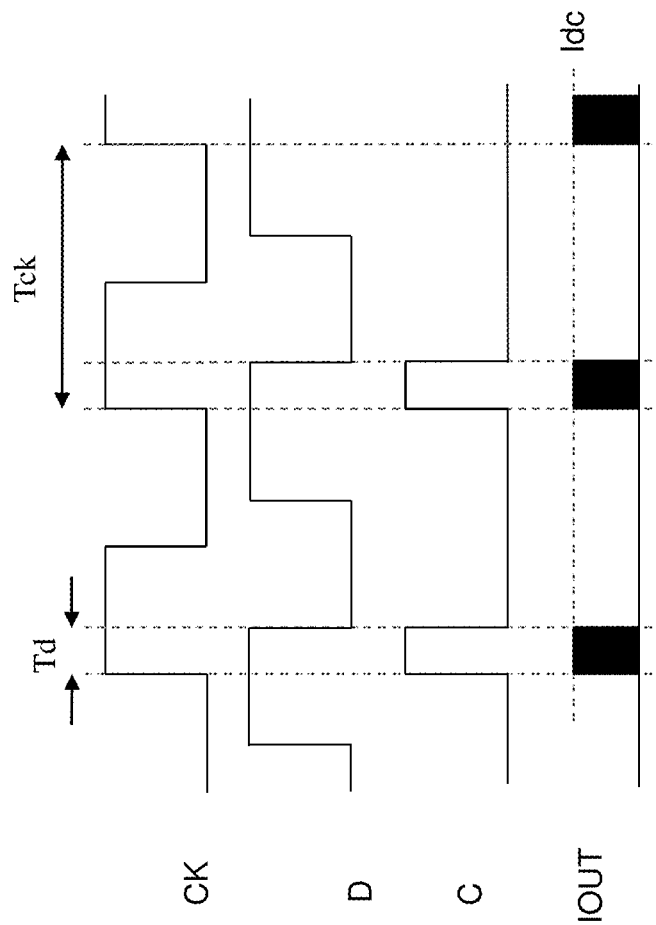
FIG. 4 depicts in a timing diagram waveforms illustrating operations of an embodiment.

FIG. 4 depicts in a timing diagram the waveforms illustrating the operation of the TCC circuit of FIG. 3. In FIG. 4, the clock signal CK is a time varying periodic clock signal; here, a 50% duty cycle is used. The D input to logic gate L1 is inverted and delayed from the CK signal so that an overlap portion is formed that is equal to the delay of the device under test ("DUT"). Note that the frequency and period of the clock signal CK are chosen so that the delay D of the device under test is less than 50% of the period Tck. The current IOUT depicts the current that flows through the impedance R1 at the output pin. This current, as shown in FIG. 4, is proportional to the delay Td.

A simple test method embodiment is to perform the following steps, in either order. First, measure the average current IDC that results at IOUT from a DC voltage to the impedance over a clock period. Second, apply the clock signal to the test circuit, and measure the average current Iavg at the output IOUT. Then, Equation 1 is used to determine the active high time Td.

The average current Iavg can be measured over many clock cycles, if desired, and then an average taken. By averaging the measurement over many cycles, slight errors are reduced or eliminated. Because the time Td is measured as a ratio of a DC current Idc and an average current Iavg, the actual value of the impedance, labeled R1 in the example embodiment, does not affect the measurement. Further, because the value of R1 is not critical, there is no need to calibrate or trim circuit elements to achieve an accurate measurement. The measurement is not affected by process or temperature dependent variations of the physical impedance.

Extending the embodiment to form alternative embodiments, a combination of logic gates may be used to extract the timing information (delay, frequency, duty cycle) present between two signals into current. Since the current for the difference between the two signals can be compared to a current corresponding to a known or reference signal, the unknown timing information can be determined from the currents.

The time to current converter circuit embodiment of FIG. 3 is simple to design and requires little silicon area to implement. In an example semiconductor process it was implemented in less than 1000 square microns. No expensive counters, shift registers, or numerous matched delay buffer or delay line elements are needed. No lengthy calibrations are necessary before measurements are made. While an embodiment method for making a measurement using an external current meter is described above, as an alternative embodiment, an on chip current measurement circuit may be used. Use of the embodiments can provide a time delay measurement for complex integrated circuits where probing or other methods to test internal nodes is not practical or desirable.

The TCC of FIG. 3 has exceptional range and resolution. For an example implementation, a range of 10 picoseconds-5 nanoseconds, with a resolution of 1 picosecond, was observed. The prior art devices require far more silicon; have less range, and lower resolutions than provided by the embodiments.

Figure 5:
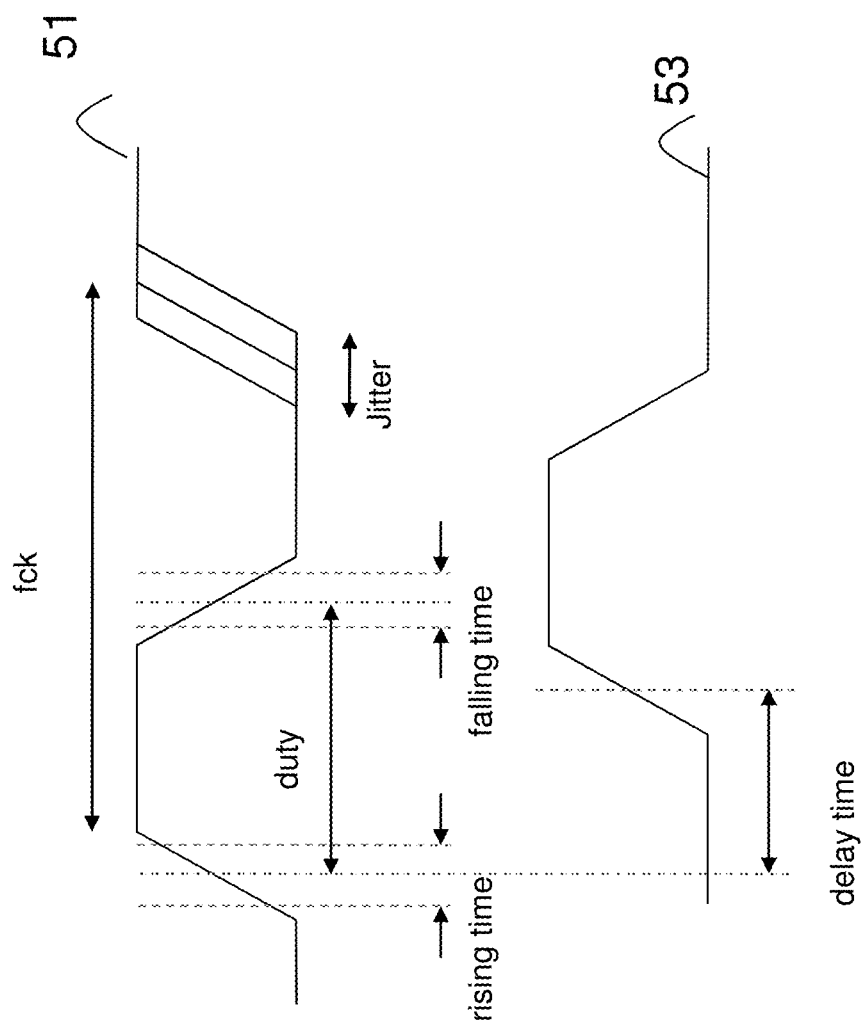
FIG. 5 depicts waveforms illustrating time quantities that may be measured by use of the embodiments.

There are many applications for the embodiment time to current converter circuit and the method embodiments. FIG. 5 depicts, in a waveform timing diagram, a variety of measurements that can be made using the circuits and the methods described above. In the upper waveform 51, the figure illustrates the frequency of a clock signal fck, which can be determined. The duty cycle and active high time for a periodic signal as shown in waveform 51 can be measured. The rising time and falling time for a periodic signal, such as a clock signal, can be determined. Jitter, that is, the variations in a periodic signal, can be measured. In FIG. 5 a second waveform 53 is shown delayed from the upper waveform 51. As shown in the figure, the delay time of a signal relative to a known signal can be measured, or time delay through a portion of a circuit can be measured as described above.

Figure 6:
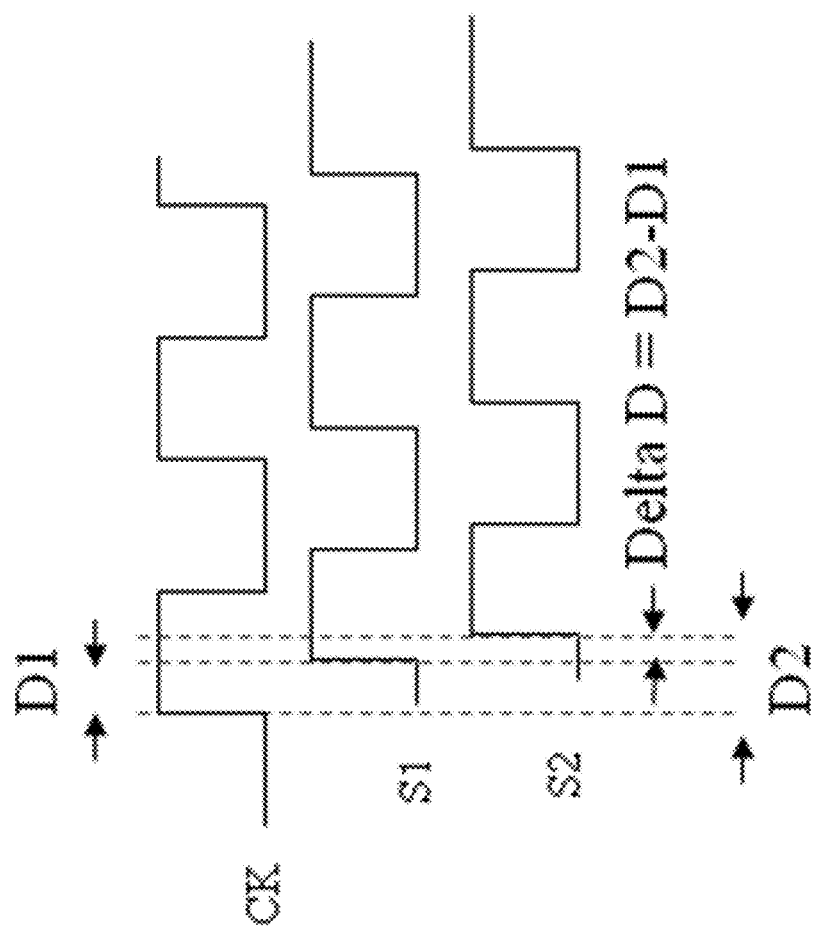
FIG. 6 depicts waveforms illustrating the operation of a method embodiment for measuring a delay difference between two signals.

FIG. 6 depicts in a timing diagram a measurement that can be made by performing the TCC methods above in a repeated fashion. In FIG. 6, signals S1 and S2 are each delayed from the clock signal CK. The phase difference "Delta D" between signal S1 and S2 is very small; thus, a direct measurement of this phase difference is not possible.

In an embodiment, a measurement of the delay D1 between the clock signal CK and the signal S1 is first made using the above delay measurement approach. The delay D2 is also measured by using the signal S2 in the delay measurement as described above. The difference Delta D between the delay D1 and the delay D2 is thus D2−D1 as shown. By repeatedly using a number of the timing extraction procedures, further timing information may be obtained. Taking repeated measurements of a signal removes measurement error and temperature dependence, increasing the accuracy of the observation. The embodiments use proportional measurement to eliminate device characteristics from the measurements, which further increase accuracy.

Figure 7:
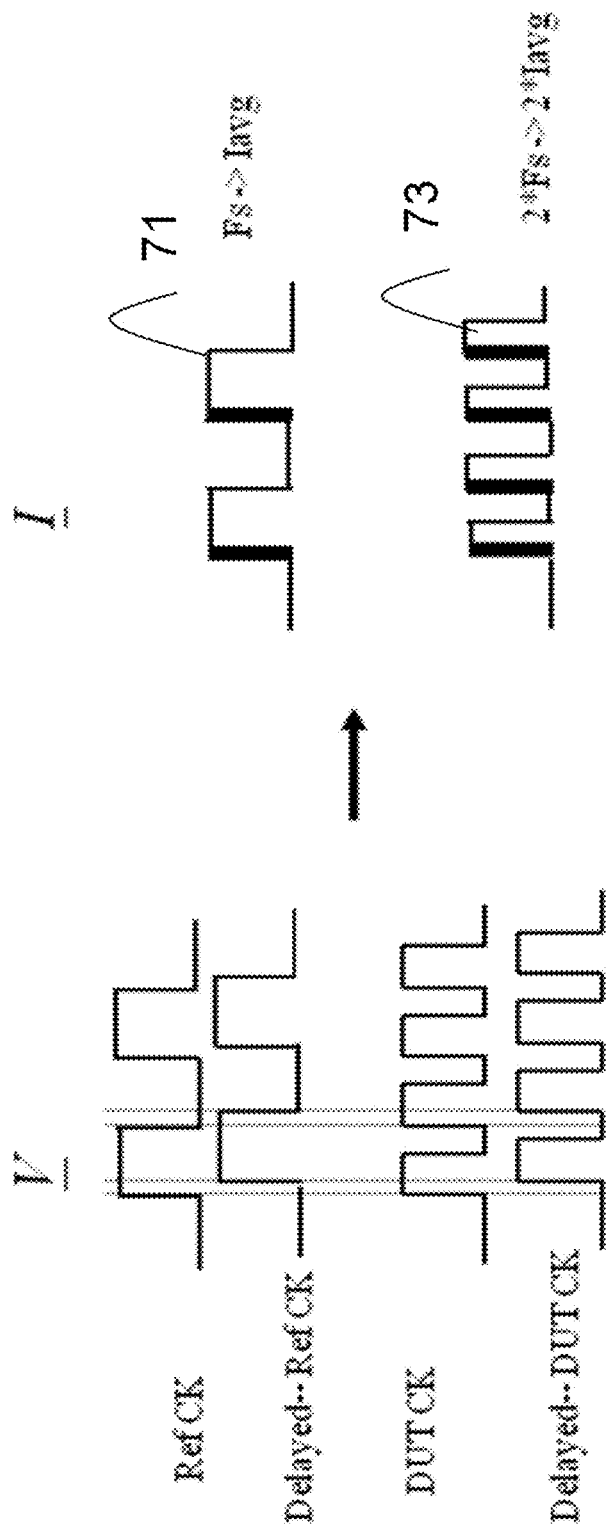
FIG. 7 depicts waveforms illustrating the operation of a method embodiment for determining frequency of an unknown signal.

FIG. 7 depicts a method for measuring frequency. In FIG. 7, the signal labeled "Ref CK" represents a known frequency signal, a reference clock. A delayed version of this signal may be logically combined, for example, "ANDed", with the reference clock as shown in the waveform labeled "Delayed—reference clock". The current Iavg through an impedance that is observed when the AND signal is routed through the impedance is then a current proportional to Fs, the frequency of the reference clock. Similarly, the signal DUT clock may be ANDed with a delayed version Delayed-DUT CK, and this waveform is also shown in FIG. 7. In FIG. 7, under the label "I", the dark portions indicate the portion of the clock signal for which the current will be observed flowing through the impedance. Thus, for the known Ref CK signal, the upper waveform labeled 71 indicates the current observed for the known signal with a frequency Fs. The waveform labeled 73 is the current observed for the DUT clock. The current observed on 73 may then be compared to the average current proportional to Fs; thus, the frequency of the DUT may be determined as a multiple of Fs. In the particular example shown, the observed current is 2Iavg, and the frequency of DUT is simply 2Fs. Since Fs is known, the DUT clock frequency may also simply be determined.

The embodiments described above are example embodiments of the time to current converter TCC. The methods are not limited to a particular circuit embodiment, structure, or limited to a particular application. The methods provide a conversion of timing information such as delay, frequency, pulse width, duty cycle, rise and fall times, jitter skew, and phase to current information, which can be measured accurately either using on-chip or off chip impedance loads. Because the value and physical characteristics of the impedance are not part of the measurement, the measurement is free from dependence on the process, and process variations, temperature and voltage dependence, and errors in measurement circuitry can be effectively removed from the measurement.

In an embodiment, a method comprises coupling a known signal to an impedance; observing the current through the impedance for a number of cycles to establish a first average current corresponding to a time related parameter of the known signal; coupling an unknown periodic signal to the impedance; observing the current through the impedance for a number of cycles to establish a second average current corresponding to a time related parameter of the unknown periodic signal; and determining a timing characteristic of the unknown signal by comparing the first and second currents.

In an embodiment, an apparatus comprises an impedance having an input for selectively receiving a time varying periodic signal or a known voltage signal; and a current output coupled to the impedance; wherein an active time of the time varying periodic signal may be determined by evaluating a ratio of a first average current observed at the current output while the periodic signal is coupled to the impedance to a second average current observed at the current output while the known voltage signal is coupled to the impedance.

In another embodiment, an apparatus comprises a clock input for receiving a known periodic clock signal; an inverter coupled to the clock input and having an output; a match delay coupled to the clock input and having an match delay output, wherein the delay of the match delay is matched to the delay of the inverter; a first terminal coupled to the output of the inverter for coupling a device under test; a second terminal coupled to the output of the device under test for receiving a delayed clock signal from the device under test; a first logic gate coupled to the output of the match delay and the second terminal, and outputting a pulse when the clock signal through the match delay output overlaps the delayed clock signal; a second logic gate coupled to the output of the first logic gate, and further coupled to a DC test input, and having an output; and an impedance coupled to the output of the second logic gate and having a current output.

In another embodiment, a method comprises providing an impedance having an input and a current output; coupling a voltage to the input of the impedance; measuring a first current that is an average current through the impedance over a period for a clock cycle; coupling a time varying periodic signal of unknown duty cycle to the impedance; measuring a second current that is the average current through the impedance due to the time varying signal over one clock cycle; and determining the active high portion of the duty cycle of the time varying periodic signal by forming the ratio of the second current to the first current and multiplying the ratio by the time duration of the clock period.

Moreover, the scope of the present application is not intended to be limited to the particular embodiments of the structures, methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method, comprising:
    coupling a known signal to an impedance through a first logic element;
    observing a first current through the impedance for a number of cycles to establish a first average current corresponding to a time related parameter of the known signal;
    inverting a first clock signal to generate an inverted first clock signal;
    delaying the first clock signal to generate a delayed first clock signal, the delay of the delayed first clock signal corresponding to a delay created by inverting the first clock signal;
    generating a delayed signal by passing the inverted first clock signal through a device under test;
    generating an unknown periodic signal by logically combining the delayed signal with the delayed first clock signal, the unknown periodic signal having a logical "on" state indicating a non-overlapping time of the delayed signal compared to the delayed first clock signal;
    coupling the unknown periodic signal to the impedance through the first logic element, the first logic element selectively providing the unknown periodic signal or the known signal to the impedance;
    observing a second current through the impedance for a number of cycles to establish a second average current corresponding to a time related parameter of the unknown periodic signal; and
    determining a timing characteristic of the unknown signal by comparing the first and second currents, the timing characteristic being determined independent of the physical value of the impedance.

2. The method of claim 1, wherein the known signal is a clock signal with a known frequency.

3. The method of claim 1, wherein the impedance is a linear impedance.

4. The method of claim 3, wherein the impedance is a resistor.

5. The method of claim 1, wherein the impedance is a non-linear impedance.

6. The method of claim 1, wherein the known signal is a DC voltage.

7. The method of claim 1, wherein the known signal is a time varying periodic signal of a fixed duty cycle.

8. The method of claim 1, wherein determining a timing characteristic by comparing further comprises taking a ratio of the first and second currents.

9. An apparatus, comprising:
    a time to current converter, comprising:
        a first logic gate for receiving a delayed signal from a device under test and a delayed clock input, the first logic gate outputting a time varying periodic signal having a high logic state corresponding to the non-overlapping time of the high logic states of delayed signal and the delayed clock input; and
        a second logic gate coupled at a first input to the output of the first logic gate and coupled at a second input to a known voltage signal input;
    an impedance having an input coupled to the output of the second logic gate for selectively receiving the time varying periodic signal or a known voltage signal; and
    a current output coupled to the impedance;
    wherein an active time of the time varying periodic signal is determined by evaluating a ratio of a first average current observed at the current output while the time varying periodic signal is coupled to the input of the impedance to a second average current observed at the current output while the known voltage signal is coupled to the input of the impedance.

10. The apparatus of claim 9, wherein the known voltage signal is a DC voltage.

11. The apparatus of claim 9, wherein the known voltage signal is a known clock signal.

12. The apparatus of claim 9, wherein the time varying periodic signal is a clock signal of unknown duty cycle.

13. The apparatus of claim 12, wherein the duty cycle for the clock signal is determined by multiplying the ratio of the first average current to the second average current by the time duration for a single clock period.

14. The apparatus of claim 9, wherein the impedance comprises a resistor.

15. The apparatus of claim 9, wherein the known voltage signal is a DC voltage signal.

16. A method, comprising:
    providing an impedance having an input and a current output;
    coupling a known signal to the impedance;
    measuring a first current that is an average current through the impedance over a number of clock cycles;
    coupling an inverted form of a clock signal having a known duty cycle to a device under test;
    coupling a delayed clock signal to a first input of a logic gate, the delayed clock signal being a delayed form of the clock signal, a delay of the delayed clock signal matching the delay of the inverted form of the clock signal; receiving a test signal from the device under test and coupling the test signal to a second input of the logic gate;
    generating a time varying periodic signal of unknown timing characteristics with the logic gate by logically combining the test signal with the delayed clock signal;
    coupling the time varying periodic signal of unknown timing characteristics to the impedance;
    measuring a second current that is the average current through the impedance due to the time varying periodic signal over a number of cycles; and
    determining at least one unknown timing characteristic of the time varying periodic signal by forming a ratio of the second current to the first current and multiplying the ratio by the time duration of a clock period;
    wherein the at least one unknown timing characteristic includes one selected from a group consisting essentially of a duty cycle, frequency, and a delay.

17. The method of claim 16, wherein providing the impedance comprises providing a linear impedance.

18. The method of claim 16, wherein providing the impedance comprises providing a resistor formed on an integrated circuit.

19. The method of claim 16, and further comprising:
measuring a first average current in the impedance over a clock period of the clock signal, the current responsive to an output of the logic gate when the clock signal is not overlapped by the delayed clock signal; and
determining the delay in the device under test by calculating a ratio of the first average current to a second average current measured in the impedance from a DC level voltage output by the logic gate over a clock period.

20. The method of claim 16, wherein the known signal is a DC signal.

* * * * *